United States Patent
Vedantham et al.

(10) Patent No.: US 7,853,856 B2
(45) Date of Patent: Dec. 14, 2010

(54) FORMING OF ERROR CORRECTION DATA

(76) Inventors: Ramakrishna Vedantham, 814 W. Royal La., #349, Irving, TX (US) 75039; David Leon, 900 Meadow Creek Dr., #3061, Irving, TX (US) 75038; Igor Curcio, Hatanpään valtatie 12 C 57, FIN-33100, Tampere (FI)

(*) Notice: Subject to any disclaimer, the term of this patent is extended or adjusted under 35 U.S.C. 154(b) by 1214 days.

(21) Appl. No.: 11/246,920

(22) Filed: Oct. 6, 2005

(65) Prior Publication Data

US 2006/0075321 A1 Apr. 6, 2006

(30) Foreign Application Priority Data

Oct. 6, 2004 (WO) ............... PCT/IB2004/003253

(51) Int. Cl.
*H03M 13/00* (2006.01)
(52) U.S. Cl. .................. 714/776; 370/473; 714/752
(58) Field of Classification Search .......... 714/752, 714/786, 776, 746; 370/473
See application file for complete search history.

(56) References Cited

U.S. PATENT DOCUMENTS

| | | | | |
|---|---|---|---|---|
| 4,962,498 A | * | 10/1990 | May, Jr. ........................ | 370/474 |
| 5,872,798 A | * | 2/1999 | Baggen et al. .............. | 714/755 |
| 6,141,788 A | * | 10/2000 | Rosenberg et al. .......... | 714/774 |
| 6,172,972 B1 | | 1/2001 | Birdwell et al. | |
| 6,895,019 B2 | * | 5/2005 | Gibson et al. ............... | 370/473 |
| 7,017,102 B1 | * | 3/2006 | Kristensson et al. ........ | 714/786 |
| 7,330,460 B1 | * | 2/2008 | Hagirahim et al. .......... | 370/352 |
| 2003/0058958 A1 | | 3/2003 | Shokrollahi et al. | |
| 2004/0075593 A1 | | 4/2004 | Shokrollahi et al. | |
| 2006/0285149 A1 | * | 12/2006 | Dei ............................. | 358/1.15 |
| 2007/0022352 A1 | * | 1/2007 | Eroz et al. ................... | 714/752 |
| 2007/0186133 A1 | * | 8/2007 | Stare .......................... | 714/746 |

FOREIGN PATENT DOCUMENTS

WO WO 99/04338 1/1999
WO WO 2004/034589 4/2004

OTHER PUBLICATIONS

Michael Luby, Digital Fountain—Application-layer FEC erasure codes and cellular multicast/broadcast standards pp. 1-45.*

(Continued)

*Primary Examiner*—Sam Rizk

(57) ABSTRACT

The invention relates to the generation of error correction data for available data packets and to the reconstruction of missing data packets based on available data packets and available error correction data. In order to enable an efficient error correction, the data packets are distributed at an encoding end to at least one block of data symbols, each data symbol being of equal size. Then all data symbols of a respective block are used in an encoding operation for forming a respective one of at least one error correction symbol for this block. At a decoding end, received data packets are distributed again to a block of data symbols and missing data packets are reconstructed based on these data symbols and on error correction symbols associated to the block.

15 Claims, 9 Drawing Sheets

OTHER PUBLICATIONS

"Integrated Packet Loss and Error Control Schemes in Wireless Multimedia Data Links;" J. Wu et al; IEEE, 2001.

"Packet/Cell Loss Recovery Using Variable FEC Matrix for Real Time Transport Services Over Best Effort Networks;" M. Hayasaka et al; IEEE; 2003.

"FLUTE—File Delivery Over Unidirectional Transport;" T. Paila et al; RMT Internet draft; Jun. 2004.

"An RTP Payload Format for Generic FEC;" Adam H Li; Internet draft; Jul. 2004.

"An RTP Payload Format for eneric Forward Error Correction;" J. Rose et al; RFC 2733; 1999.

"An RTP Payload Format for Erasure-Resilient Transmission of Progressive Multimedia Streams;" G. Liebl et al; Internet draft; Oct. 2003.

"RTP Payload Format for Generic FEC-Encoded Time-Sensitive Media;" M. Luby et al; Internet draft; 2004.

"Matrix approach vs. packet approach for MBMS application layer FEC;" Siemens; 3GPP TSG-SA4; Feb. 23-27, 2004.

"Outer Coding at the BM-SC for IP Packet Recovery in MBMS;" Siemens; 3GPP SA4; Nov. 24-28, 2003.

"FEC Architecture for MBMS Streaming Services;" Ericsson; 3GPP TSG-SA4; Aug. 16-20, 2004.

"Requirements on FEC Architecture and Codes for MBMS Streaming;" 3GPP TSG-SA4; Aug. 16-20, 2004.

"Digital Video Broadcasting (DVB); DVP spec. for data broadcasting;" ETSI EN301192 V1.4.1; Jun. 2004.

\* cited by examiner

FORMING OF ERROR CORRECTION DATA

CROSS REFERENCE TO RELATED APPLICATION

This application claims priority under 35 USC §119 to International Patent Application No. PCT/IB04/003253 filed on Oct. 6, 2004.

FIELD OF THE INVENTION

The invention relates to a method, a processing module, an electronic device, a software code and a software program product for generating error correction data for available data packets. The invention relates equally to a method, a processing module, an electronic device, a software code and a software program product for reconstructing missing data packets based on available data packets and available error correction data. The invention further relates to a communication system enabling a generation of error correction data and a reconstruction of missing data packets based on available error correction data.

BACKGROUND OF THE INVENTION

When a transmitting end transmits media objects in the form of data packets to a receiving end, for instance via the Internet or an IP based wireless network, some of the data packets may be lost on the way. It is therefore common practice to transmit in addition error correction data to the receiving end. The error correction data may enable the receiving end to restore lost data packets to a considerable extent.

For Multimedia Broadcast Multicast Services (MBMS) download services, for example, which distribute data packets via the Internet or an IP based wireless network, a Forward Error Correction (FEC) at the application layer is used according to the RMT internet draft draft-ietf-rmt-flute-08.txt: "FLUTE—File Delivery over Unidirectional Transport", Jun. 5, 2004. By using a simple source-blocking algorithm, the source data can be conveniently arranged into equal length packets and the packets can be FEC encoded to produce parity packets. The size of the packet can be conveniently chosen to satisfy the underlying network requirement.

The packetization and FEC encoding process which is employed for MBMS download services is illustrated in FIG. 1. For the FEC encoding process, K data packets 13 of equal size S are formed from available data. Data symbols at the same position in each data packet 13 are used for generating (N-K) FEC symbols or parity symbols. Dotted lines in FIG. 1 represent a respective single codeword 19 consisting of K data symbols and (N-K) parity symbols. The codeword 19 can be for example a systematic RS codeword. The ith parity symbols in each codeword, with i=0 to (N-K), then form a respective parity packet 16, which are transmitted together along with the data packets 13.

At the receiving end, lost data packets 13 can then be recovered, if any K (1+ϵ) packets 13, 16 out of a total of N packets are received. Here, ϵ is known as the reception overhead or decoding inefficiency. For Reed-Solomon (RS) Codes, ϵ is equal to zero. This scheme of packetization will be referred to in the following as a "packet-based approach".

According to the technical document 3GPP S4-040549: "Requirements on FEC Architecture and Codes for MBMS Streaming", an FEC at the application layer is to be used as well for MBMS streaming. A FEC architecture for MBMS streaming shall include the packetization, interleaving, FEC encoding and FEC decoding procedures that meet these requirements.

For MBMS streaming services, however, the packet based approach described above for MBMS download services has severe disadvantages. For MBMS streaming services, the media objects are segmented into packets using the Realtime Transfer Protocol (RTP)/User Datagram Protocol (UDP)/Internet Protocol (IP), where the size of the RTP packets of the application layer is variable and highly media dependent. Padding bits could be employed to obtain equal size data packets from variable size RTP packets, but this could result in a significant wastage of FEC overhead. Alternatively, the media-encoders, like H.264 encoders, could be requested to provide almost equal-size RTP packets, but MBMS streaming services shall support a wide range of source-encoders, which may not all output equal-length RTP packets. Moreover, MBMS streaming shall support pre-encoded media streams also. Hence, it is necessary to use an approach which supports the use of an FEC with variable size RTP packets instead of equal length packets.

There exist several IETF frameworks that facilitate the use of an application layer FEC for streaming, but which do not meet the requirements of an FEC architecture for MBMS streaming.

The frameworks presented in the IETF document RFC 2733: "An RTP Payload Format for Generic Forward Error Correction", December 1999, and in the Internet Draft IETF I-D ULP draft-ietf-avt-ulp-10.txt: "An RTP Payload Format for Generic FEC", Jul. 18, 2004, both have the drawback that they are applicable only to simple XOR based FEC codes, while there exist much more powerful FEC codes, like Reed-Solomon codes, Low Density Parity Check (LDPC) codes, Raptor codes, etc., that have moderate or at least manageable complexity. Moreover, in the case of the RFC 2733, the FEC can be used to protect at the most 24 data packets, and in the case of the ULP draft, the FEC can be used to protect at the most 48 data packets. Thus the block length of the FEC is limited to 24 or 48 data packets, respectively. Reed-Solomon and LDPC codes, however, need larger block lengths that cannot be provided by the presented packetization frameworks. Moreover, both documents recommend the use of zero-padding in order to deal with variable size RTP packets. If the variation in the RTP packet length is high, this results in a significant amount of FEC being used to protect zero-padded bits. The ULP document moreover supports unequal error protection that may or may not be used at all for MBMS streaming.

The framework presented in the Internet Draft IETF I-D UXP draft-ietf-avt-uxp-06.txt: "An RTP Payload Format for Erasure-Resilient Transmission of Progressive Multimedia Streams", October 2003, has the drawback that it destroys the original RTP packet structure by interleaving. It is a requirement of the above cited specification S4-040549, however, to preserve the original RTP packets so that also receiving ends not supporting the FEC are able to obtain the original RTP packets. Moreover, this document is applicable to Reed-Solomon codes only, while there exist more powerful yet less complex FEC codes, like LDPC, Raptor etc. The UXP draft moreover supports as well unequal error protection that may or may not be used at all for MBMS streaming.

The Internet draft IETF I-D draft-luby-avt-rtp-generic-fec-00.txt: "RTP Payload Format for Generic FEC-Encoded Time-Sensitive Media", Jul. 9, 2004, proposes as well to borrow the packet-based approach of the FLUTE architecture for streaming, for instance by including an FEC Payload Identity (ID) comprising a Source Block Number (SBN) and an Encoding Symbol ID (ESI) in the RTP payload. The SBN identifies a source block to which the RTP packet belongs. The ESI indicates an address or position of the first byte of the RTP packet in the matrix. But the document does not give any details of a packetization, interleaving, encoding and decoding of any particular FEC.

In order to address some of the difficulties mentioned above, in addition matrix-based approaches have been proposed for packetization of streaming data for FEC encoding, instead of the packet-based approach. For instance, in the ETSI document EN 301 192 c1.4.1 (2004-06): "Digital Video Broadcasting; DVB Specification for Data Broadcasting", Reed-Solomon codes are specified to be used for an FEC at the link layer. The matrix-based approach is employed to efficiently deal with variable size IP datagrams in the packetization for the FEC.

Such a matrix-based approach is illustrated in FIG. 2, which presents the employed matrix structure.

A fixed size matrix comprises N=255 columns and a pre-specified number of rows. Each row comprises one byte per column. The first K=191 columns of the matrix are filled column by column with variable size IP datagrams 23 arranged back-to-back. The last column or columns, which can not be filled with an entire IP datagram anymore, are filled with padding data 25.

An RS (255,191) code is applied across each row of 191 data bytes to produce 64 parity bytes. Thus, each row of the matrix contains a systematic 255-byte long RS codeword 27 comprising 191 data bytes and 64 parity bytes 26. The IP datagrams 23 in the matrix are transmitted independently from each other, along with an additional field that indicates their address in the matrix. The parity bytes 26 are equally transmitted as IP datagrams along with their address in the matrix.

A receiving end can then form a corresponding matrix with whatever IP datagrams it had received by using the address of the datagrams in the matrix. A decoder associated to the receiving end then tries to restore the missing data bytes in the matrix by decoding each RS codeword. The RS decoders that are used for erasure correction are based on structured matrices like Vandermonde matrix or Cauchy matrix. The decoding involves (1) an inversion of a square matrix formed from a subset of the columns of Vandermonde matrix or Cauchy matrix. (2) Multiplication of the received codeword with the inverted matrix. Since each RS codeword is decoded independently, a matrix inversion and multiplication is required for each codeword. This could increase the decoding complexity when compared to the packet-based approach. In the packet-based approach, the positions of the lost bytes are the same in all rows. Thus, only one matrix inversion is needed for decoding all rows of the matrix.

In the technical documents 3GPP S4-040029: "Matrix approach vs. packet approach for MBMS application layer FEC", Feb. 23-27, 2004, and 3GPP S4-030732: "Outer coding at the BM-SC for IP packet recovery in MBMS", Nov. 24-28, 2003, it has been proposed to use a similar matrix-based approach employing RS codes at the application layer instead of at the link layer. In this case, the matrix of FIG. 2 would be filled with RTP packets instead of IP datagrams. Similar as the above mentioned document ETSI EN 301 192 c1.4.1, the documents S4-030732 and S4-040029 describe how to apply RS code independently across each row of this matrix.

In the technical document 3GPP S4-040526: "FEC architecture for MBMS Streaming Services", Aug. 16-20, 2004, it has equally been proposed to use a matrix-based approach to support an FEC for MBMS streaming. It is suggested to include an ESI and an SBN in each RTP packet, and in addition the Source-Block Length (SBL) in each FEC RTP packet. However, it does not describe how data symbols are to be mapped into codewords. The document describes only a generic architecture which allows applying any type of FEC for MBMS streaming. Moreover, after an FEC decoding with the matrix-based approach, the Media RTP packets must be read out from the matrix for consumption, that is, for media decoding or playout. With the current set of fields defined in document S4-040526, it is not possible to recognize the boundaries of the Media RTP packets in the matrix, though.

SUMMARY OF THE INVENTION

It is an object of the invention to enable an efficient error correction coding of data packets, in particular of variable length data packets.

For an encoding end, a method for generating error correction data for available data packets is proposed. The method comprises distributing the data packets to at least one block of data symbols, each data symbol being of equal size. The method further comprises using all data symbols of a respective block in an encoding operation for forming a respective one of at least one error correction symbol for this block.

For an encoding end, moreover a processing module for generating error correction data for available data packets is proposed. The processing module is adapted to distribute available data packets to at least one block of data symbols, each data symbol being of equal size. The processing module is further adapted to use all data symbols of a respective block in an encoding operation for forming a respective one of at least one error correction symbol for this block.

For an encoding end, moreover an electronic device is proposed which comprises the processing module proposed for an encoding end.

For an encoding end, moreover a software code for generating error correction data for available data packets is proposed. When running in a processing module, the software code realizes the steps of the method proposed for an encoding end.

For an encoding end, moreover a software program product is proposed, which stores the software code proposed for an encoding end.

For a decoding end, a method for reconstructing missing data packets based on available data packets and available error correction data is proposed. This method comprises distributing the available data packets to a block of data symbols, each data symbol being of equal size and each data packet being associated to a known position in the block, wherein the available error correction data includes at least one error correction symbol for the block of data symbols, which at least one error correction symbol has been formed based on all available and all missing data symbols of a corresponding block in an encoding operation. The method further comprises reconstructing the missing data symbols and hence packets based on the received data symbols and on the at least one error correction symbol associated to this block.

For a decoding end, moreover a processing module for reconstructing missing data packets based on available data packets and available error correction data is proposed. This processing module is adapted to distribute available data packets to a block of data symbols, each data symbol being of equal size and each data packet being associated to a known position in the block, wherein the available error correction data includes at least one error correction symbol for this block of data symbols, which at least one error correction symbol has been formed based on all available and all missing data symbols of a corresponding block in an encoding operation. The processing module is further adapted to reconstruct the missing data symbols and hence data packets based on the received data symbols and on the at least one error correction symbol associated to this block.

For a decoding end, moreover an electronic device is proposed which comprises the processing module proposed for a decoding end.

For a decoding end, moreover a software code for reconstructing missing data packets based on available data packets and available error correction data is proposed. When running in a processing module, the software code realizes the steps of the method proposed for a decoding end.

For a decoding end, moreover a software program product is proposed, which stores the software code proposed for a decoding end.

Finally, a communication system is proposed, which comprises at least one processing module as proposed for an encoding end and at least one processing module as proposed for a decoding end.

It is to be noted that in the scope of this document, the expression "data packets" always means "media data packets" and the expression "data symbols" always means "media data symbols".

The invention proceeds from the consideration that a row-wise or column-wise encoding of data symbols arranged in the form of a matrix corresponding to one block is not suited for all coding schemes. It is therefore proposed using instead all data symbols of a block to calculate any required error correction symbol.

It is an advantage of the invention that by distributing data packets to equally sized data symbols, it is not required to produce fixed length data packets at an encoder or to use excessive padding to deal with variable length data packets.

At the same time, the invention allows using efficient coding schemes, which involve a low complexity and a better protection due to the use of a large block sizes.

In one embodiment of the invention, the encoding operation uses an LDPC erasure code for forming the error correction symbols. Examples of LDPC erasure codes include, but are not limited to, Raptor Codes, Luby Transform (LT) Codes, Low-Density Generator Matrix (LDGM) codes and Tornado codes. LDPC erasure codes are efficient when applied over large block lengths and they have a low decoding complexity.

In one embodiment of the invention, the data symbols of a respective block are arranged in the form of a matrix and fill one row of this matrix or one column of this matrix after the other, similar as in known matrix-based approaches. With the approach of the invention, which uses all data symbols for the error correction symbols, the number of rows and columns of the matrix can be chosen arbitrarily. They only depend on the required size of the matrix and the desired size of the data symbols.

In one embodiment of the invention, the block size is determined before the data packets are distributed to the data symbols. If the block size is not fixed, it can be adapted to the respective situation in which the data packets are to be provided. The block size may be the same, however, for an entire service for which the data packets are provided and may thus have to be determined only once for a service.

It is proposed to identify symbols across a set of packets belonging to a source-block.

The invention can be employed at various protocol layers and for various applications. In one embodiment of the invention, the error correction symbols may be generated for example at an application layer and in this case, the data packets may comprise RTP packets. In another embodiment of the invention, the error correction symbols may be generated for example at a link layer, and in this case, the data packets may comprise IP datagrams.

Depending only on the future development of corresponding standards, both approaches may be employed for example for MBMS services in general or for DVB-handheld services. The invention is of particular advantage for MBMS streaming services, though, since so far, no comprehensive and efficient solutions have been proposed for these services.

In one embodiment of the invention, the formed error correction symbols for a respective block are encapsulated in at least one error correction packet. This ensures that they can be further used, in particular be transmitted, in the same way as the data packets.

After an error correction at the decoding end, the data packets must be read out again from a block of data symbols starting from the first packet. As mentioned above, the document S4-040526 proposes to include an ESI field in the RTP packets. This field is only useful for arranging the received RTP packets in a block, for example in a matrix, for the error correction, though. For some services, like MBMS services, data packets do not comprise a field identifying the end of a data packet in the block per se either.

In one embodiment of the invention, therefore an information item is added to each of the data packets before their distribution to at least one block of data symbols. The information item advantageously indicates a length of the respective data packet, in particular the total length of the packet, including the header, header extensions, payload format and payload. The information item may be included in a dedicated additional field, for instance a field "PacketLength".

At a receiving end, the information item may then be used for extracting the available data packets and the reconstructed data packets from a current block for forming a data packet stream.

For packets comprising error correction data, no such field is required, because error correction packets do not have to be read out again after the error correction.

BRIEF DESCRIPTION OF THE FIGURES

Other objects and features of the present invention will become apparent from the following detailed description considered in conjunction with the accompanying drawings.

DETAILED DESCRIPTION OF THE INVENTION

Figure 1:
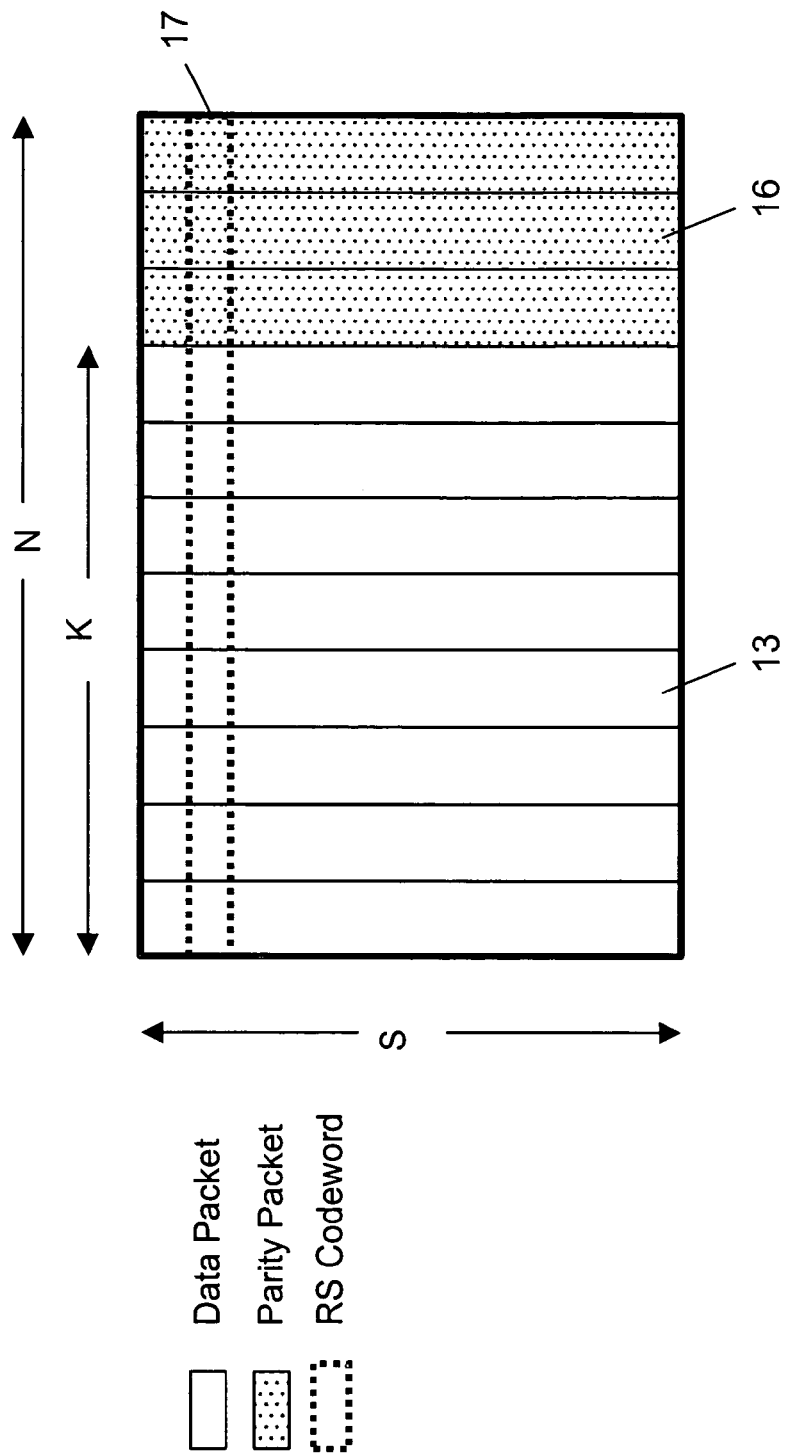
FIG. 1 is a diagram illustrating a conventional packet-based FEC encoding.
Figure 2:
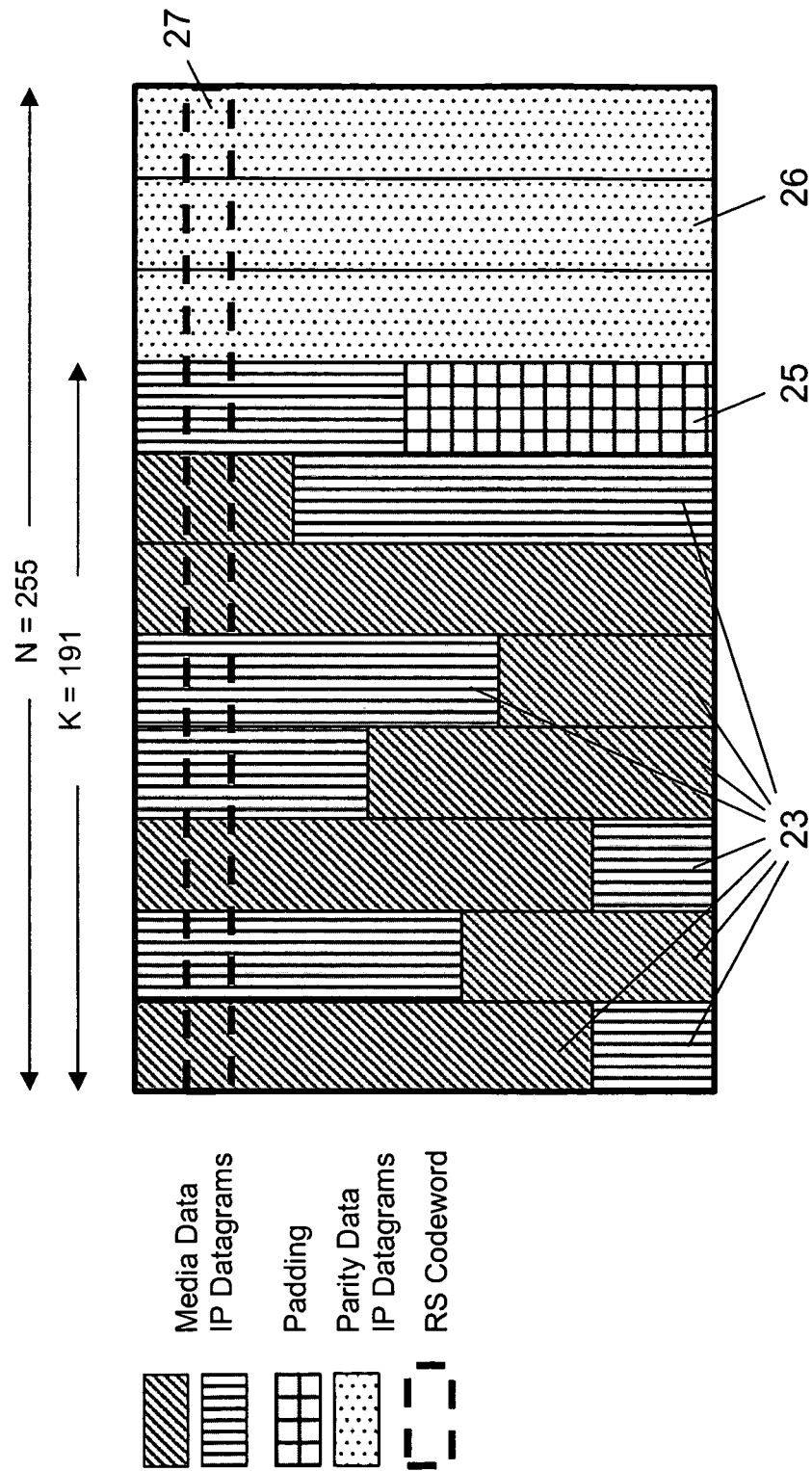
FIG. 2 is a diagram illustrating a conventional matrix-based FEC encoding.
Figure 3:
FIG. 3 is a schematic diagram of a communication system according to an embodiment of the invention.

FIG. 3 is a schematic diagram of a communication system, in which data packets are FEC encoded and decoded in accordance with an embodiment of the invention.

The system comprises a transmitting device 31 and a receiving device 35, which are able to communicate with each other via the Internet or an IP based wireless network 39. The transmitting device 31 can be for example an MBMS server and the receiving device 35 can be for example a PC or mobile terminal which enables a user to request an MBMS streaming session from the MBMS server.

The transmitting device 31 comprises a processing module 32 to which Media RTP packets are provided, whenever such Media RTP packets are to be transmitted via the Internet or the IP based wireless network 39 to various receiving devices 35 in the scope of an MBMS streaming session. The processing module 32 runs an LDPC erasure code based FEC encoding software for encoding the Media RTP packets on an application level. The processing module 32 provides modified Media RTP packets and FEC RTP packets for transmission via the Internet or the IP based wireless network 39, as will be described in more detail further below with reference to FIGS. 4 to 6.

The receiving device 35 comprises a processing module 36, which receives Media RTP packets and FEC RTP packets via the Internet or the IP based wireless network 39 in the scope of a requested MBMS streaming session. The processing module 36 runs an LDPC erasure code based FEC decoding software for decoding the Media RTP packets on an application level, if required. In an ideal case, the software provides all original media RTP packets, which had been provided to the processing module 32 of the transmitting device 31, for a playback, as will be described in detail further below with reference to FIGS. 7 to 9.

Figure 4:
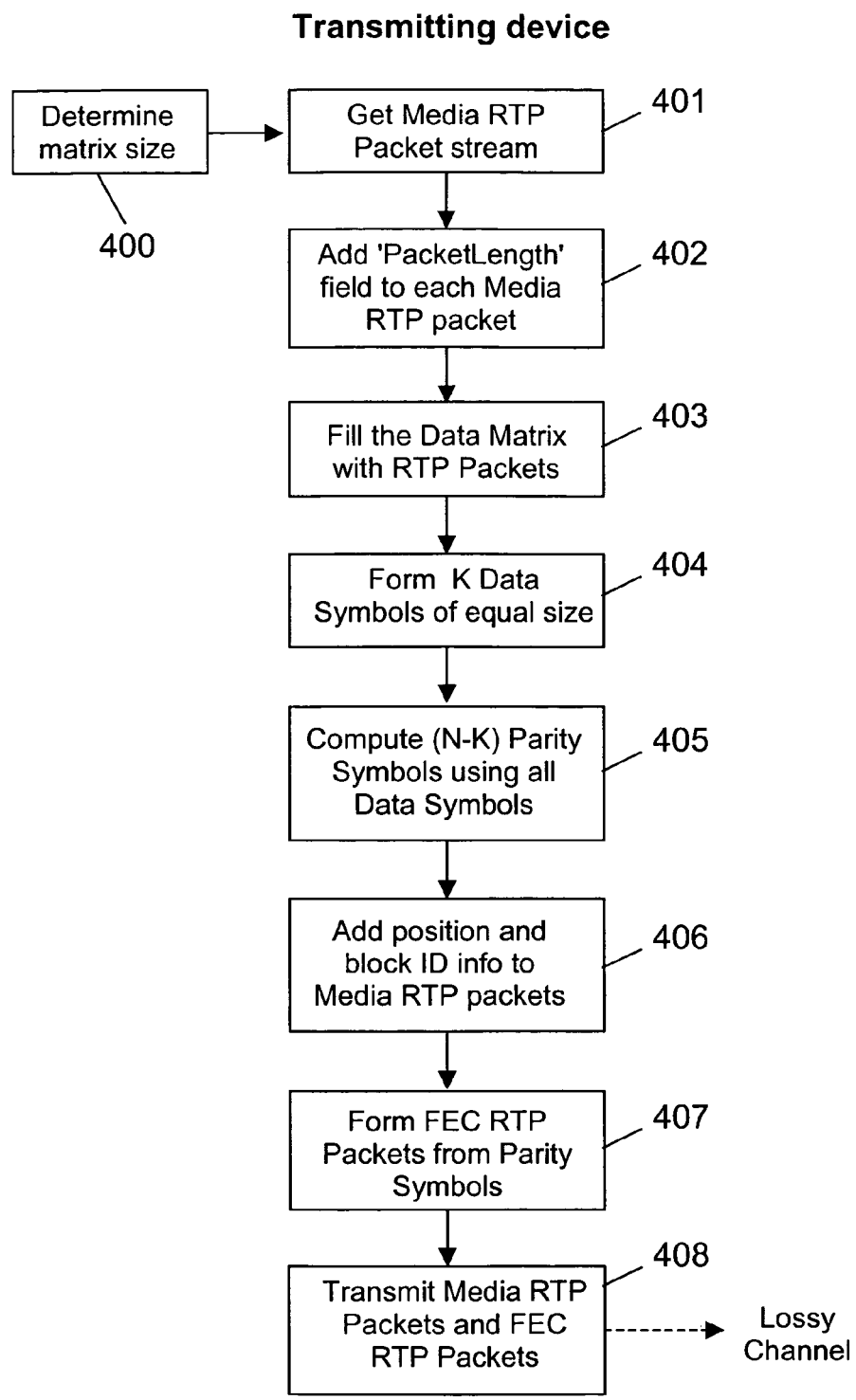
FIG. 4 is a flow chart illustrating an operation at the transmitter side in the system of FIG. 3.
Figure 5:
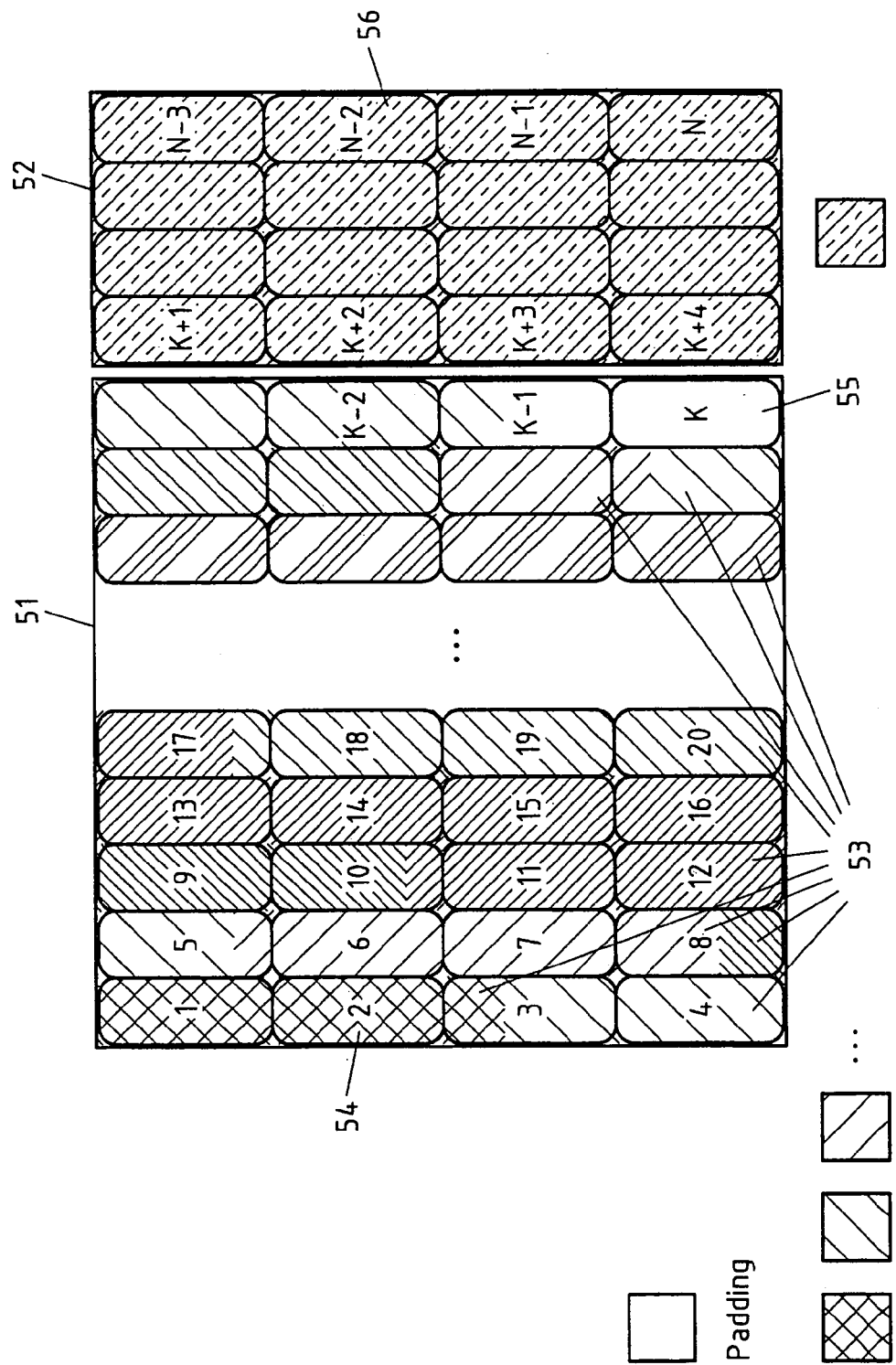
FIG. 5 is a diagram illustrating a matrix structure employed in the operation illustrated in FIG. 4.

FIG. 4 is a flow chart illustrating the operation of the processing module 32 of the transmitting device 31, and FIG. 5 is a diagram of a matrix structure, which is employed in the scope of this operation. The matrix structure consists of two matrices. A media data matrix 51 is provided for the media data and an FEC data matrix 52 is provided for FEC data.

In a first, preparatory step (step 400), the processing module 32 determines the size of the media data matrix 51, which is to be used for FEC encoding. The size of the media data matrix 51 is determined according to a maximum permissible buffer latency at the receiving device 35, the bearer speed and the FEC overhead. For example, a 64 kbps bearer might be used for MBMS streaming. Further, an FEC overhead of 20% might be used. The FEC overhead is defined as the additional FEC data expressed as a percentage of the original media data. Thus 64 kbps/(1+0.2)=53.3 kbps is used to carry the media data and the rest is used to carry FEC data. Further, the buffer latency may be 5 s, that is, the receiving device 35 has to accumulate media data and FEC data for 5 s, before it can decode and play-out the media data. In this case, the media data matrix can hold media data of a total size 53300 bits/s*5 s=265000 bits=33 Kbytes.

The number of rows and columns in the matrices are determined by the FEC scheme used. Each element in the matrix may be assumed to have a size of one byte.

If a systematic (N, K) RS code was used, as in various prior art approaches, the number of columns in the media matrix would have to be equal to K and the number of columns in the FEC matrix would have to be equal to N-K. The number of rows can be determined from the size of the media matrix and the number of columns K according to the relation: Number of rows=Size of matrix/Number of columns. With N=255 and an FEC overhead of 20%, the number of columns in the media data matrix K can be determined to be K=ceil (255/(1+0.2))= 212. If the size of the media matrix is 33 Kbytes as assumed above, the number of rows can be determined to be 33000/ 212=155. The FEC data matrix then consists of N-K=255– 212=33 columns and 155 rows. The elements of the FEC data matrix are formed by generating (N-K) parity symbols from each row of K symbols taken from media data matrix.

As an LDPC erasure code is to be used in the presented embodiment for an FEC, in contrast, the number of rows and columns can be chosen arbitrarily, depending on the encoding symbol size and subject to the constraint on the determined size of the media data matrix. In either case, the media data matrix is able to hold exactly K data symbols 54 of equal size. The size of the data symbol 54 can be advantageously chosen to suit the (N, K) of the employed LDPC erasure code. For the above example of a media data matrix of 33 Kbytes, a data symbol size of 128 bytes could be selected. The number of rows could then be equal to the data symbol size. In this case, the number of columns would be 33000/128=258. Alternatively, the number of rows could be four times the data symbol size, that is, 128*4=512. In this case, the number of columns would be 33000/512=64. Further alternatively, the number of rows could be equal to 1. In this case, the number of columns would be 33000.

In preparation of the MBMS session, the determined dimensions of the data matrix and the selected size of the data symbols 54 are signaled by the transmitting device 31 to the receiving devices 35.

While step 400 may be performed once for the entire MBMS streaming session, the further operation is repeated on a block-by-block basis.

First, the processing module 32 receives variable size Media RTP packets 53, for example from a storage (step 401).

Each media RTP packet 53 is supplemented with a "PacketLength" field (step 402). This field represents the total length of the Media RTP packet including the header, header extensions, payload format and payload. The additional field "PacketLength" may be included in the RTP header extension, in the FEC Payload ID or in any payload format.

The supplemented Media RTP packets 53 are fed one after the other and column by column into the media data matrix 51, until all columns are filled (step 403). A Media RTP packet 53 is not split up between two consecutive media data matrices 51, though. Thus, if the last column or columns of the media data matrix 51 cannot be filled up with an entire Media RTP packet 53 anymore, some padding data 55 is used to fill the media data matrix 51. All Media RTP packets 53 fitting into a single media data matrix 51 are considered to belong to one block.

Next, the data is taken from the media data matrix 51 again on a data symbol 54 by data symbol 54 basis (step 404). The extracted K data symbols 54 are numbered in FIG. 5 from 1 to K.

The K data symbols 54 are encoded to produce (N-K) parity symbols 56 (step 405). The N-K parity symbols 56 are numbered in FIG. 5 from K+1 to N. The size of the parity symbols 56 is the same as the size of the data symbols 54. It has to be noted that a single data symbol 54 can span across two consecutive media RTP packets 53. This means that a data symbol 54 will not be available for decoding, if any one of the Media RTP packets 53 that it spans across is lost.

Any systematic LDPC erasure code can be used to produce the N-K parity symbols 56 from the K data symbols 54.

By way of example, the use of a systematic Raptor code will be described with reference to FIG. 6, which employs a set of non-systematic KEYs to produce the parity symbols 56 from data symbols 54.

Figure 6:
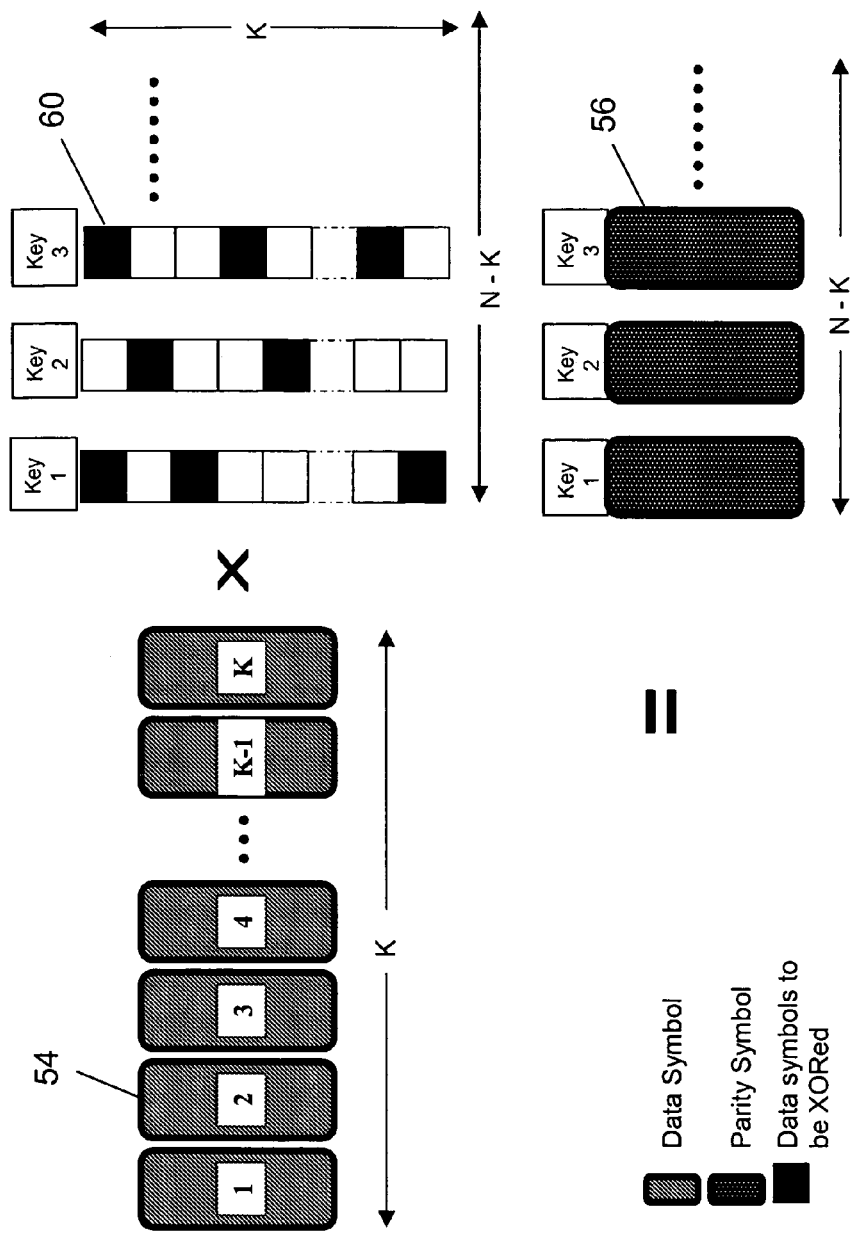
FIG. 6 is a diagram illustrating an FEC encoding employed in the operation illustrated in FIG. 4.

In the top left-hand corner of FIG. 6, the K data symbols 54 extracted from the media matrix 51 are presented. In the top right-hand corner of FIG. 6, N-K KEYs in form of a respective KEY column 60 are presented. The K data symbols 54 are multiplied symbol-wise with the K entries of each of (N-K) KEY columns 60, the multiplications with each of the KEY columns 60 resulting in a respective parity symbol 56. Randomly placed dark boxes in each KEY column 60 indicate that a data symbol 54 multiplied with this entry is to be XORed within the respective KEY column 60 to form the associated parity symbol 56. For example, with the first KEY column the first data symbol, the third data symbol, etc., and the last data symbol are combined in an XOR operation to obtain the first parity symbol. With the second KEY column, the second data symbol, the fifth data symbol, etc. are combined in an XOR operation to obtain the second parity symbol. With the third KEY column, the first data symbol, the fourth data symbol, etc., and the second but last data symbol are combined in an XOR operation to obtain the third parity symbol, etc. The (N-K) KEY columns can be generated online. The resulting parity symbols 56 are presented down on the right in FIG. 6.

Alternatively to the Raptor code, for example an LDGM erasure code could be employed. In this case, the K data symbols 54 are multiplied with an LDGM. The set of (N-K) KEY columns 60 in FIG. 6 may then form part of the pre-computed generator matrix.

The employed set of KEYs 60, the employed LDGM, or some other employed LDPC matrix are signaled by the transmitting device 31 to the receiving device 35. For systematic Raptor codes, a set of systematic KEYs and a set of non-systematic KEYs 60 are signaled. Details on these KEYs can be found for example in the documents U.S. 2004/0075593 A1 and WO 2004/034589 A2. With reference to the Raptor Codes, the receiving device 35 needs a KEY 60 for each parity symbol 56 to identify the indices of data symbols 54 that were XORed to form that parity symbol 56. The KEYs 60 do not have to be communicated online to the receiving device 35, that is, in RTP packets 53. Instead, a known set of KEYs 60 could also be signaled at the beginning of the streaming session, for example together with the dimensions of the media data matrix and the size of the data symbols. All blocks in the streaming session may use the same set of KEYs 60. In case of LDGM and LDPC codes, the receiving device 35 has to know the parity check matrix. Thus the set of KEYs is equivalent in this case to a parity check matrix.

Before transmission, each Media RTP packet 53 is appended with an additional field that identifies the block to which it belongs and with an additional field that indicates its position or address relative to the first byte in the media data matrix 51 (step 406). The above cited document S4-040526 already proposes to include two additional fields SBN and ESI in the RTP Payload format for Media RTP packets. The SBN identifies the source block to which the respective Media RTP packet 54 belongs. The ESI indicates the address/position of the first byte of the Media RTP packet 54 in a media data matrix 51.

The (N-K) parity symbols 56 are encapsulated into multiple FEC RTP packets (step 407). Each FEC RTP packet is formed by concatenating an appropriate RTP header, one or more parity symbols 56 and an additional field that indicates the addresses of the parity symbols in the FEC data matrix 52. The above cited document S4-040526 already proposes to include three additional fields SBN, ESI and SBL in the RTP Payload format for FEC-RTP packets. The SBN identifies the source block to which the respective FEC RTP packet belongs. The ESI indicates the address/position of the first byte of the FEC RTP packet in a FEC data matrix.

A single FEC-RTP packet could contain one or more parity symbols 56.

Now, the supplemented Media RTP packets and the formed FEC RTP packets are transmitted via the Internet or the IP based wireless network 39, that is, a lossy channel, to receiving devices 35. The transmitted data for one block thus consists of a stream of Media RTP packets and an associated stream of FEC RTP packets.

Figure 7:
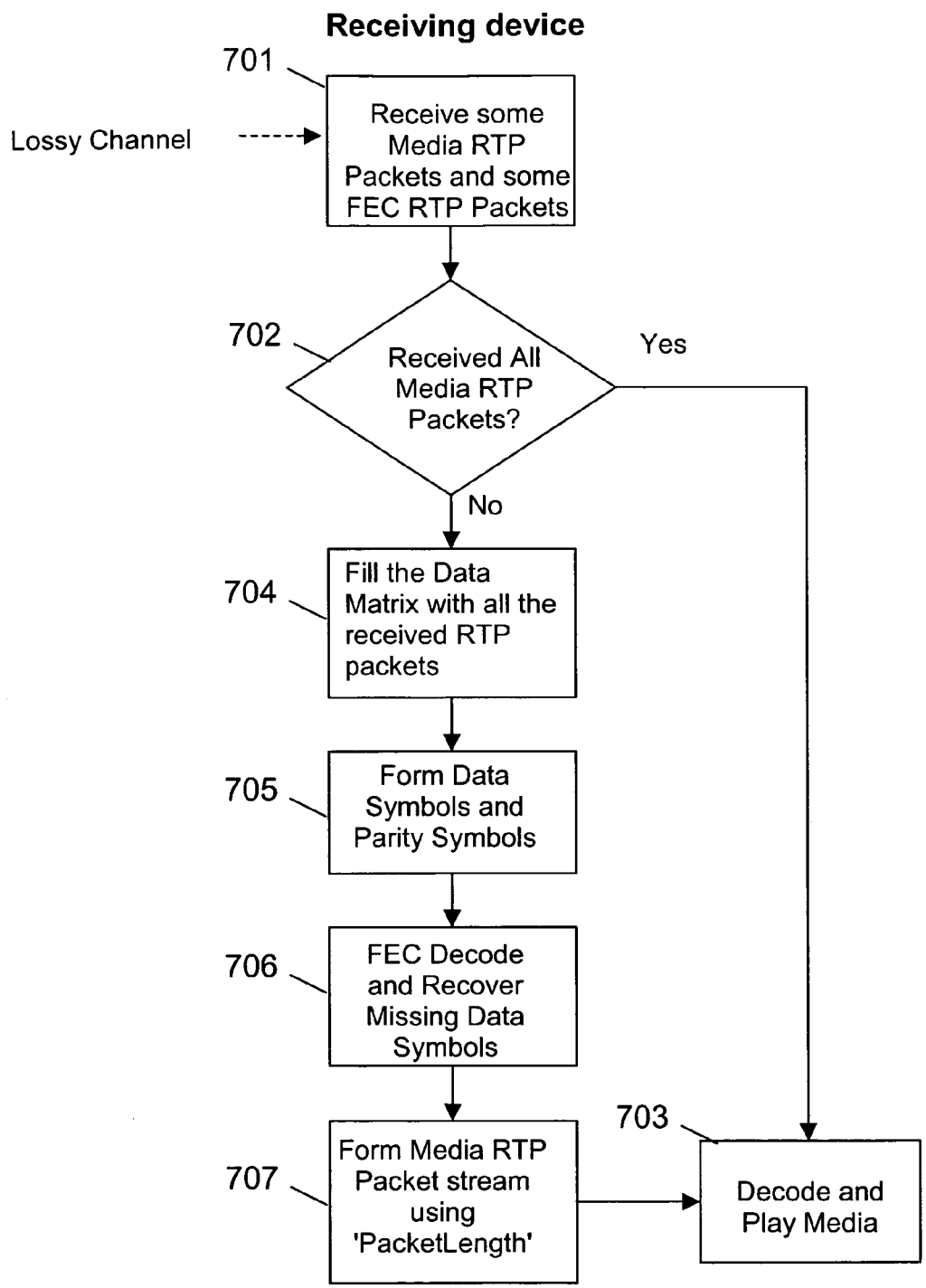
FIG. 7 is a flow chart illustrating an operation at the receiver side in the system of FIG. 3.

FIG. 7 is a flow chart illustrating the operation at the processing module 36 of one of the receiving devices 35.

The receiving device 35 receives Media RTP packets and FEC-RTP packets via the Internet or the IP based wireless network 39 (step 701).

Each RTP packet comprises an identification of the block to which it belongs, for example in form of an SBN field. For each block, the processing module determines first whether all Media RTP packets were received (step 702). If this is the case, the processing module 36 ignores the associated FEC RTP packets and provides the received Media RTP packets immediately for a conventional decoding and for playing the included media (step 703).

If some Media RTP packets have been lost in the transit, however, the processing module 36 tries first to recover them by an LDPC erasure code based FEC decoding.

Figure 8:
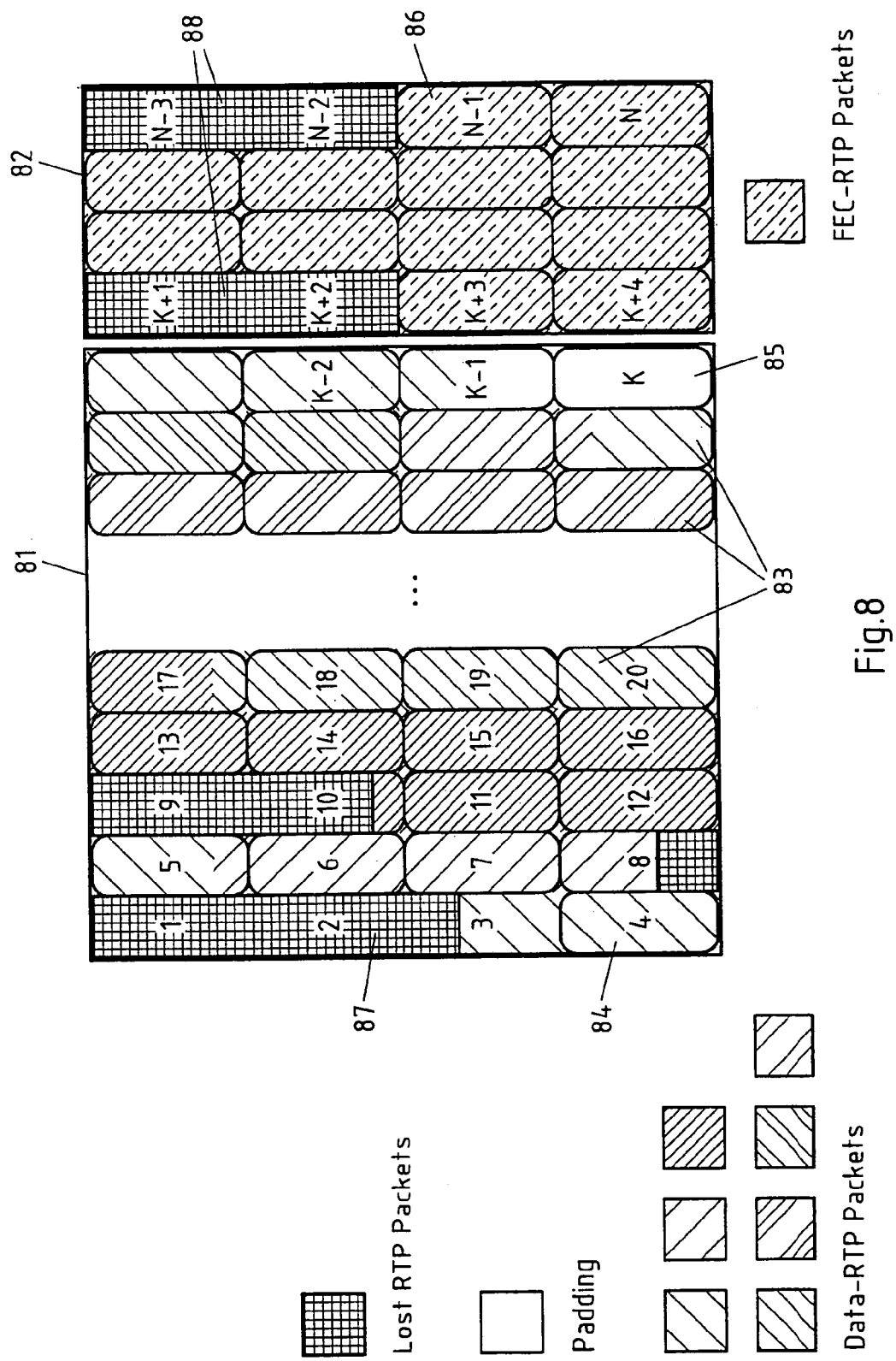
FIG. 8 is a diagram illustrating a matrix structure employed in the operation illustrated in FIG. 7.

The processing module 36 evaluates to this end position information in all successfully received RTP packets, for example the ESI in an ESI field, and inserts the Media RTP packets at a corresponding position of a media data matrix and the FEC RTP packets at a corresponding position of an FEC data matrix, after having removed the block identification and the position information from the RTP packets. FIG. 8 is a diagram of an employed matrix structure. The matrix structure corresponds to the matrix structure presented with reference to FIG. 5, and includes thus a media data matrix 81 for media data and an FEC data matrix 82 for FEC data.

Due to the lost RTP packets, the resulting matrices 81, 82 have holes. In the example of FIG. 8, the first and the fourth Media RTP packets 87 are lost. Corresponding to these lost Media RTP packets 87, the data symbols 1, 2, 3, 8, 9 and 10 are lost. Further, two FEC RTP packets 88 are lost. Corresponding to these lost FEC RTP packets 88, the parity symbols K+1, K+2, N-3 and N-2 are lost.

Figure 9:
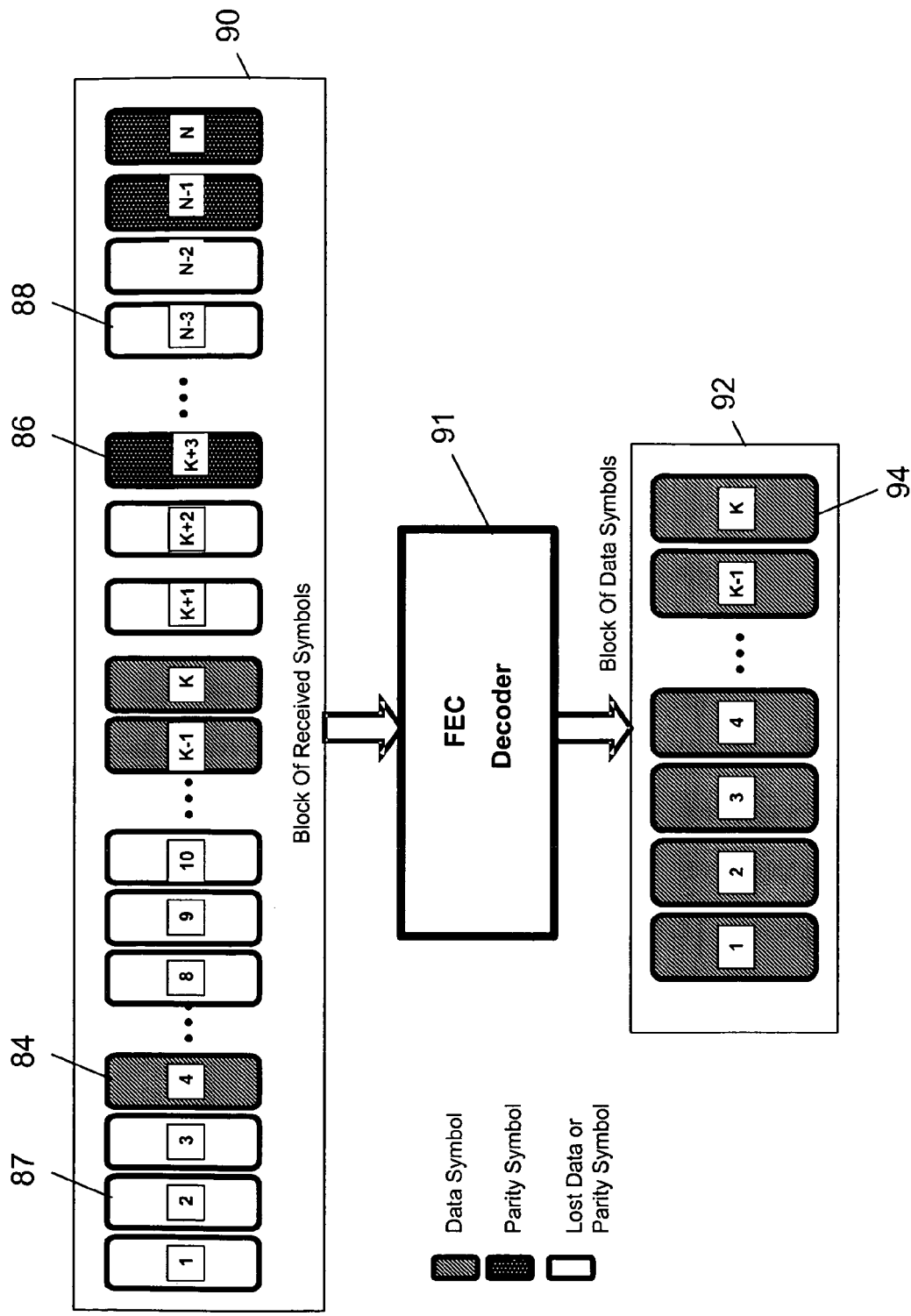
FIG. 9 is a diagram illustrating an FEC decoding employed in the operation illustrated in FIG. 7.

The processing module 36 tries to fill the holes in the media data matrix 81 by an FEC decoding, which is illustrated in addition in FIG. 9.

For the FEC decoding, the processing module 36 extracts the data symbol-wise from the matrices 81, 82 (step 705). The resulting block 90 of data symbols 84 and parity symbols 86 is shown in FIG. 9. Some data symbols and some FEC symbols do not contain any data as explained above.

The symbols 84, 86 are decoded by an FEC decoder portion 91 of the software run by the processing module 36 (step 706). The FEC decoder portion 91 inverts the encoding process described above with reference to FIG. 6. The decoder portion 91 thus outputs a block 92 of data symbols, which includes in the ideal case all original data symbols 94.

By recovering the missing data symbols 94 by an FEC decoding, the holes 87, 88 in the media-data matrix of FIG. 8 are filled up.

If the total number of data and parity symbols 84, 86 containing data is greater than a threshold $K(1+\epsilon)$, where $\epsilon$ is the reception overhead, the FEC decoding is very likely to be successful.

If the FEC decoding is not completely successful, the receiving device 35 just consumes the available Media RTP packets and may employ other error resilience tools, like error concealment.

Regardless of whether the decoding was successful or unsuccessful, the Media RTP packets must be read out from the media data matrix 81 and passed on to the next stage for consumption (step 707).

The Media RTP packets 83 must be read out starting from the first RTP packet in the media data matrix 81. For example, if the first Media RTP packet is lost as indicated in FIG. 8, the symbols 1, 2 and 3 that span these two packets are lost. After a successful FEC decoding, the symbols 1, 2 and 3 are recovered and filled in the media data matrix 81. Now the processing module 36 can read the header of the first reconstructed Media RTP packet, but it has to know in addition the end of the first Media RTP packet. This information is provided by the added "PacketLength" field indicating the length of the Media RTP packet.

The Media RTP packets are then decoded and the media is played in a conventional manner (step 703).

Summarized, the presented embodiment of the invention enables the application of efficient LDPC erasure codes in a matrix-based approach for an FEC for MBMS streaming.

It is to be noted that the described embodiment can be varied in many other ways than those indicated and that it moreover constitutes only one of a variety of possible embodiments of the invention.

What is claimed is:

1. A method for generating error correction data, the method comprising:
   receiving one or more data packets at a first device from a second device;
   distributing the one or more data packets into a block at the first device, wherein the block comprises equal size data symbols arranged column by column to form a matrix; and
   forming one or more error correction symbols for the block, wherein each of the one or more error correction symbols is formed using all of the data symbols of the block in an encoding operation at the first device.

2. The method according to claim 1, wherein the encoding operation comprises a Low Density Parity Check erasure code for forming said one or more error correction symbols.

3. The method according to claim 1, wherein the one or more error correction symbols are generated at an application layer and wherein the one or more data packets comprise Realtime Transfer Protocol packets.

4. The method according to claim 1, wherein the one or more error correction symbols are generated at a link layer and wherein the one or more data packets comprise Internet Protocol datagrams.

5. The method according to claim 1, wherein the one or more error correction symbols are generated for a Multimedia Broadcast Multicast Services streaming session.

6. The method according to claim 1, further comprising determining a size of the block.

7. The method according to claim 1, further comprising encapsulating the one or more error correction symbols for the block in at least one error correction packet.

8. The method according to claim 1, further comprising adding to each of the one or more data packets an information item which indicates a length of the one or more data packets.

9. A method for reconstructing missing data packets, the method comprising:
   receiving one or more data packets at a first device from a second device;
   receiving one or more error correction data packets at the first device from the second device;
   determining if all of the one or more data packets were received at the first device;
   if all of the one or more data packets were not received, evaluating positioning information of the one or more data packets;
   distributing the one or more data packets to a block of data symbols, wherein the block of data symbols comprises equal size data symbols and each data packet is associated with a known position in the block of data symbols;
   distributing the one or more error correction data packets to a block of error correction symbols; and
   recovering the one or more data packets that were not received based on the data symbols and based on the error correction symbols.

10. A method according to claim 9, further comprising extracting the one or more data packets and the one or more recovered data packets from the block of data symbols, based on an information item in each data packet indicating a length of the data packet.

11. A device for generating error correction data, the device comprising:
   a communication interface configured to receive one or more data packets; and
   a processing module configured to cause the device to:
   distribute the one or more data packets into a block, wherein the block comprises equal size data symbols arranged column by column to form a matrix; and
   form one or more error correction symbols for the block, wherein each of the one or more error correction symbols is formed using all of the data symbols of the block in an encoding operation.

12. The device of claim 11, wherein the encoding operation comprises a Low Density Parity Check erasure code for forming said one or more error correction symbols.

13. A device for reconstructing missing data packets, the device comprising:
   a communication interface configured to receive one or more data packets and one or more error correction data packets; and
   a processing module configured to cause the device to
   determine if all of the one or more data packets were received;
   if all of the one or more data packets were not received, evaluate positioning information of the one or more data packets;
   distribute the one or more data packets to a block of data symbols, wherein the block of data symbols comprises equal size data symbols and each data packet is associated to a known position in the block of data symbols;
   distribute the one or more error correction data packets to a block of error correction symbols; and
   recover the one or more data packets that were not received based on the data symbols and based on the error correction symbols.

14. The device of claim 13, wherein the one or more data packets are Media RTP packets and the one or more error correction data packets are FEC RTP packets.

15. The device of claim 13, wherein the block of data symbols comprises a media data matrix and the block of error correction symbols comprises a FEC data matrix.

* * * * *

UNITED STATES PATENT AND TRADEMARK OFFICE
CERTIFICATE OF CORRECTION

| | | |
|---|---|---|
| PATENT NO. | : 7,853,856 B2 | Page 1 of 1 |
| APPLICATION NO. | : 11/246920 | |
| DATED | : December 14, 2010 | |
| INVENTOR(S) | : Vedantham et al. | |

It is certified that error appears in the above-identified patent and that said Letters Patent is hereby corrected as shown below:

Title Page 2, item (56), under "Other Publications", in Column 1, Line 10, delete "eneric" and insert -- Generic --.

Column 3, line 24, delete "can not" and insert -- cannot --.

Column 9, line 6, delete "media matrix 51" and insert -- media data matrix 51 --.

Column 9, line 41, delete "RTP packets 53." and insert -- Media RTP packets 53. --.

Column 9, line 56, delete "Media RTP packet 54" and insert -- Media RTP packet 53 --.

Column 9, line 57, delete "Media RTP packet 54" and insert -- Media RTP packet 53 --.

Column 10, lines 54-55, delete "decoder portion 91" and insert -- FEC decoder portion 91 --.

Column 12, line 41, in Claim 13, delete "to" and insert -- to: --.

Signed and Sealed this
Twenty-fourth Day of May, 2011

David J. Kappos
*Director of the United States Patent and Trademark Office*